(12) United States Patent
Yamamoto

(10) Patent No.: US 6,737,719 B1
(45) Date of Patent: May 18, 2004

(54) IMAGE SENSOR HAVING COMBINATION COLOR FILTER AND CONCAVE-SHAPED MICRO-LENSES

(75) Inventor: Katsumi Yamamoto, Shanghai (CN)

(73) Assignee: OmniVision International Holding Ltd, Cayman Islands (KN)

( * ) Notice: Subject to any disclaimer, the term of this patent is extended or adjusted under 35 U.S.C. 154(b) by 66 days.

(21) Appl. No.: 10/280,394

(22) Filed: Oct. 25, 2002

(51) Int. Cl.⁷ .......................................... H01L 31/0232
(52) U.S. Cl. .................... 257/432; 257/53; 257/225; 257/290; 438/70; 438/710
(58) Field of Search .................... 257/432, 53, 225, 257/226, 233, 290, 291, 292, 293, 369, 440, 431–436, 443, 444; 438/70, 710, 725, 65

(56) References Cited

U.S. PATENT DOCUMENTS

| | | | | |
|---|---|---|---|---|
| 5,595,930 A | * | 1/1997 | Baek | 437/53 |
| 5,691,548 A | * | 11/1997 | Akio | 257/232 |
| 5,997,756 A | * | 12/1999 | Okazaki et al. | 216/26 |
| 6,066,511 A | * | 5/2000 | Fukusyo | 438/60 |
| 6,188,094 B1 | * | 2/2001 | Kochi et al. | 257/232 |
| 6,252,219 B1 | * | 6/2001 | Abe | 250/208.1 |
| 6,255,640 B1 | * | 7/2001 | Endo et al. | 250/208.1 |
| 6,261,861 B1 | | 7/2001 | Pai et al. | |
| 6,274,917 B1 | | 8/2001 | Fan et al. | |
| 6,297,071 B1 | | 10/2001 | Wake | |
| 6,362,513 B2 | | 3/2002 | Wester | |
| 6,436,851 B1 | | 8/2002 | Young et al. | |

* cited by examiner

Primary Examiner—Nathan J. Flynn
Assistant Examiner—Remmon R Forde
(74) Attorney, Agent, or Firm—Perkins Coie LLP (57) ABSTRACT

An image sensor is disclosed that has a concave micro-lens structure. The image sensor includes a plurality of pixels formed in a semiconductor substrate, each pixel including a light sensitive element. Further, a base material having a first index of refraction is formed over the pixels. Micro-lens cavities are formed in the base material over the light sensitive elements, the micro-lens cavity having a concave shape. Finally, color filters are formed into the micro-lens cavities, the color filters having a second index of refraction that is higher than the first index of refraction.

20 Claims, 8 Drawing Sheets

FIGURE 1

(PRIOR ART)

IMAGE SENSOR HAVING COMBINATION COLOR FILTER AND CONCAVE-SHAPED MICRO-LENSES

TECHNICAL FIELD

The present invention relates to image sensors, and more particularly, towards an image sensor that has a short focal length.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. An important part of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

Figure 1:
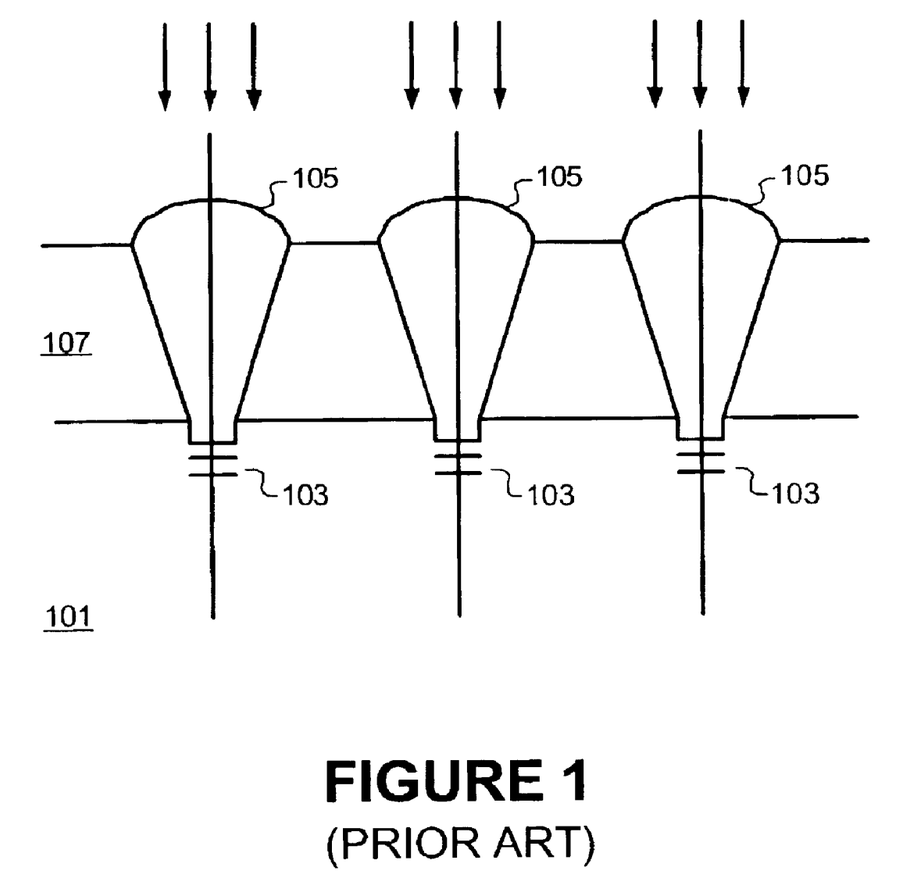
FIG. 1 is a prior art cross sectional view of a portion of an image sensor.

Conventionally, micro-lenses are formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Moreover, in the region between the light detecting elements 103 and the micro-lens 105, denoted by reference numeral 107, there are various intervening layers that would typically include the color filter layers and various metal conducting lines. These components are excluded from the diagram in order to simplify the explanation herein and not to obscure the invention.

It has been found that the convex shape of the micro-lenses will sometimes result in a greater likelihood of particle contamination, due to later processing steps. Furthermore, because of the particular processes used to form the micro-lenses, it is difficult to eliminate gaps between the micro-lenses 105. Generally, it is desirable to minimize the gaps between the micro-lenses, since a larger micro-lens will result in a higher degree of light concentration.

Further, the combination of the convex micro-lens and the color filter layer provides a combined thickness that would normally require a micro-lens with a relatively long focal length, which can be difficult to manufacture at higher, integration densities.

DETAILED DESCRIPTION

The present invention relates to a concave micro-lens structure for use with image sensors, either of the CMOS or CCD type. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 2:
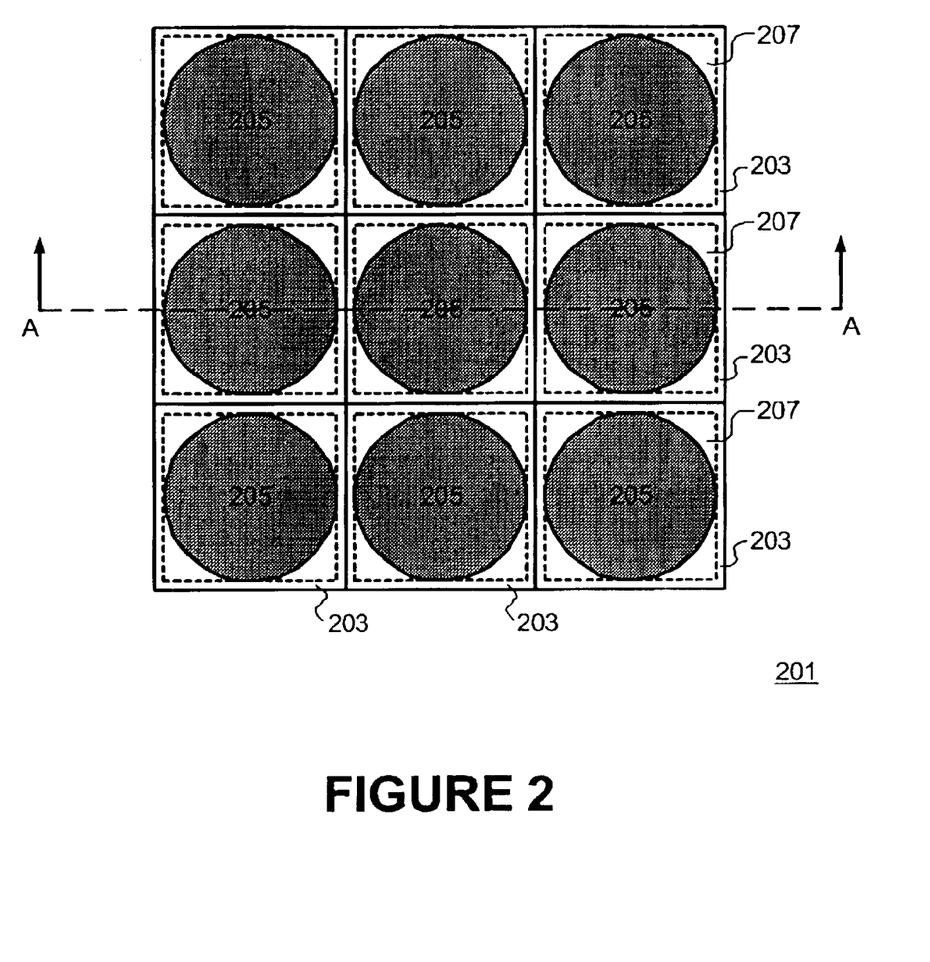
FIG. 2 is a top view of an image sensor showing pixels arranged in a two dimensional array and with micro-lenses formed thereon.

FIG. 2 shows a top view of an image sensor 201 formed in accordance with the present invention. The image sensor 201 includes a plurality of pixels 203 typically arranged in a two dimensional array. In the example shown in FIG. 2, the image sensor shows a three by three array of pixels 203, though it can be appreciated that an actual mage sensor 201 would have many more pixels, arranged in perhaps over a thousand rows and/or a thousand columns.

Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2; In one embodiment, the pixels 203 may be active pixels, commonly known in the prior art.

Formed atop of each pixel 203 is a micro-lens 205. The micro-lens 205 is concave in nature, in contrast to the prior art convex micro-lens. Because of the nature of the concave micro-lenses 205, little or no gap exists between adjacent micro-lenses of adjacent pixels.

Additionally, associated with each pixel 203 is a color filter 207. The color filter 207 may be placed either between the micro-lens 205 and the light sensitive element, or alternatively, be formed atop of the micro-lens 205. The color filter 207 is typically a pigmented or dyed material that will only allow a narrow band of light to pass therethrough, for example, red, blue, or green. In other embodiments, the color filter may be cyan, yellow, or magenta. These are but example colors for the color filters 207 and the present invention is meant to encompass a color filter 207 having any color. While the use of pigmented or dyed color materials is the most prevalent form of color filters, other reflective type color filters may be used, such as a multilayer stack reflective material. The formation of color filters 207 is known in art and will not be described herein to avoid any unnecessary obscuration with the description of the present invention. For example, U.S. Pat. No. 6,297,071, U.S. Pat. No. 6,362,513, and U.S. Pat. No. 6,271,900 show the current state of the color filter art.

Figure 3:
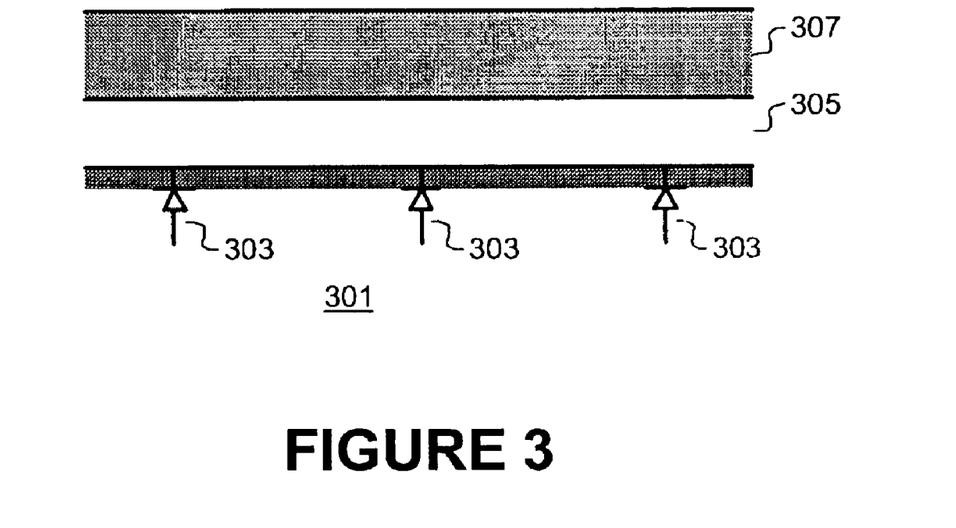
FIGS. 3–9 are cross sectional and corresponding top views of a semiconductor substrate illustrating one method for forming the apparatus of the present invention.

FIGS. 3–9 are schematic cross sectional and top views of a semiconductor substrate illustrating one method for forming the structure of the present invention. Specifically, FIG. 3 is a cross-sectional view taken along line A—A of FIG. 2. A semiconductor substrate 301 has a plurality of light sensitive elements 303 (associated with the pixels 203 of FIG. 2) formed therein. FIG. 3 shows the light sensitive element 303 as a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. No. 5,904,493 and U.S. Pat. No. 6,320,617.

According to one embodiment, after the pixels 203 are formed in the substrate, an optically transparent (in at least a portion of the visible spectrum) base material 305 is formed over the substrate 301. The base material 305 may be formed using a blanket deposition process, or alternatively, using a spin on method. In one embodiment, the base material is an epoxy or an acrylic. These materials are chosen because of their stability, each of handling, or appropriate index of refraction. As will be seen below, it is important that the base material have a relatively low index of refraction. For an epoxy or acrylic material, the index of refraction is in the 1.4 to 1.5 range. One example of a suitable material is polymethylmethacrylate (PMMA) or polyglycidylmethacrylate (PGMA). Alternatively, the base material may be an oxide.

While specific examples are given above, it can be appreciated that the base material may be formed from any optically transparent material having a relatively low index of refraction. In the case where the base material 305 is applied using spin on techniques, the base material 305 has the advantage of being substantially planar. It is desirable to have the base material 305 have a top surface that is as planar and smooth as possible. Nevertheless, a blanket deposition, such as by chemical vapor deposition, may also be suitable.

In one embodiment, the thickness of the base material 305 is on the order of 2 to 2.5 microns. However, thinner or thicker layers of the base material 305 may also be used, depending on various design parameters, such as desired focal length of the micro-lens.

Still referring to FIG. 3, after the base material 305 has been deposited, a resin layer 307 is deposited. The resin layer 307 is also referred to as a sacrificial layer, and in-one embodiment, is a phenyl resin. Because the resin layer 307 will be used as a sacrificial layer, again, there is some flexibility in the precise material used for the resin layer 307.

In one embodiment, the resin layer 307 will need to be patterned. Because of this, it is efficient to use a photoresist type material (such as a phenyl resin) as the resin layer 307. In that way, the resin layer 307 can be "directly patterned" by simply the use of a photolithography apparatus and a developing process.

Figure 4:
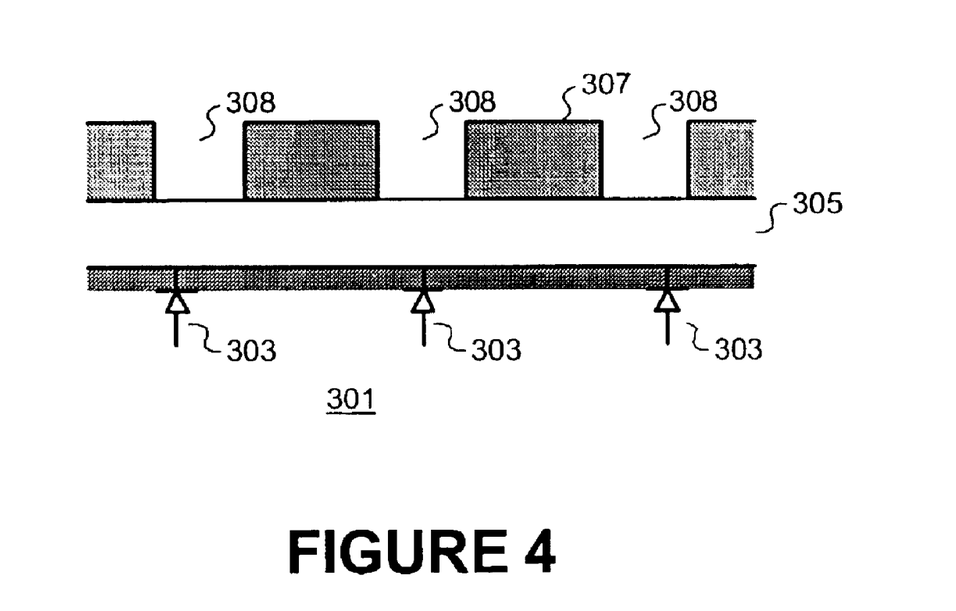
Figure 5:
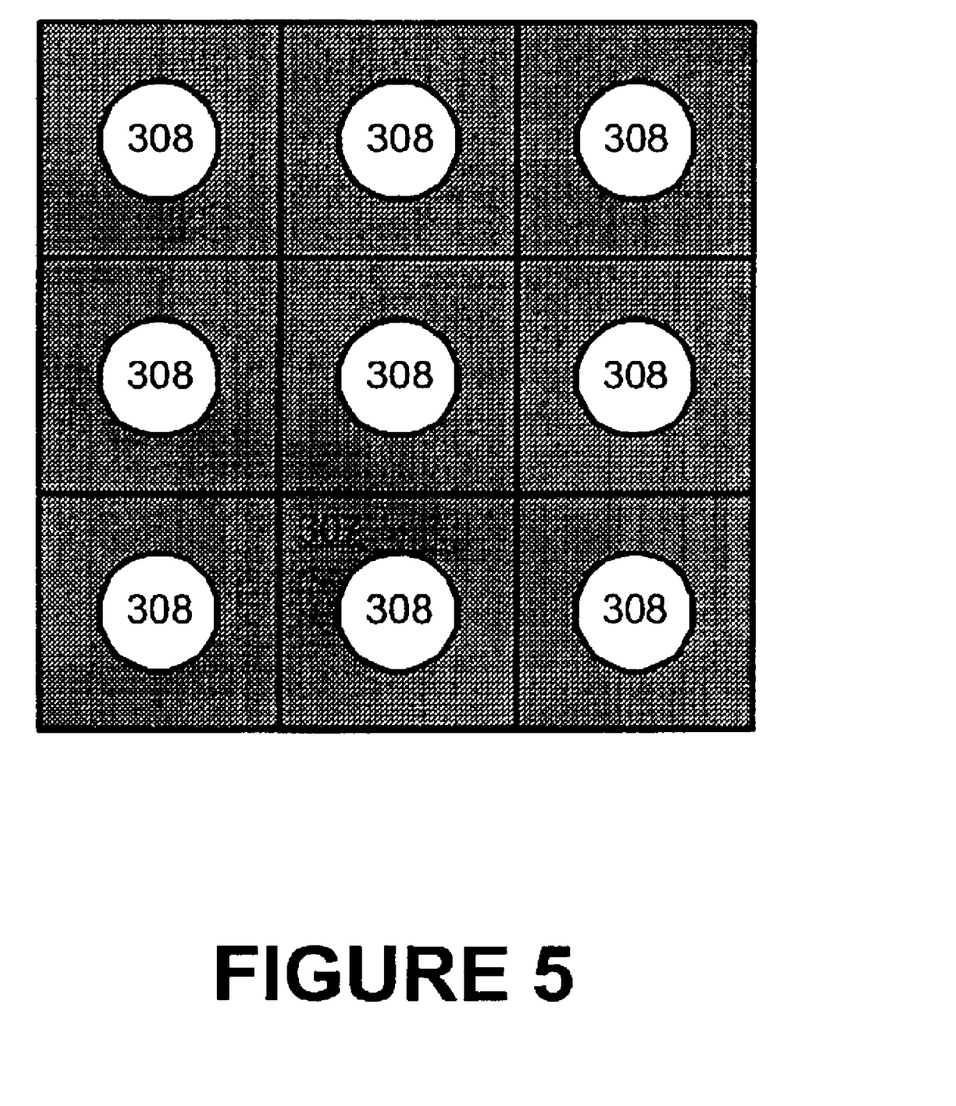

Turning next to FIG. 4, the resin layer 307 is patterned and developed to remove portions 308 of the resin layer 307. The portions 308 of the resin layer 307 that are removed are generally over the light sensitive elements 303 and are circular in shape. A top view of the resin layer 307 showing portions removed is shown in FIG. 5. The removed portions 308 of the resin layer 307 is related to the concave micro-lens to be eventually formed. Again, the specific shape and dimensions of the removed portions shown in FIGS. 4 and 5 is but one specific embodiment of the present invention. Other specific implementations are possible. For example, the size of the portions 308 shown in FIGS. 4 and 5 may be made smaller or larger depending upon the desired size of the micro-lenses to be formed. A larger size for the portion 308 will result in a larger micro-lens, and vice versa.

Figure 6:
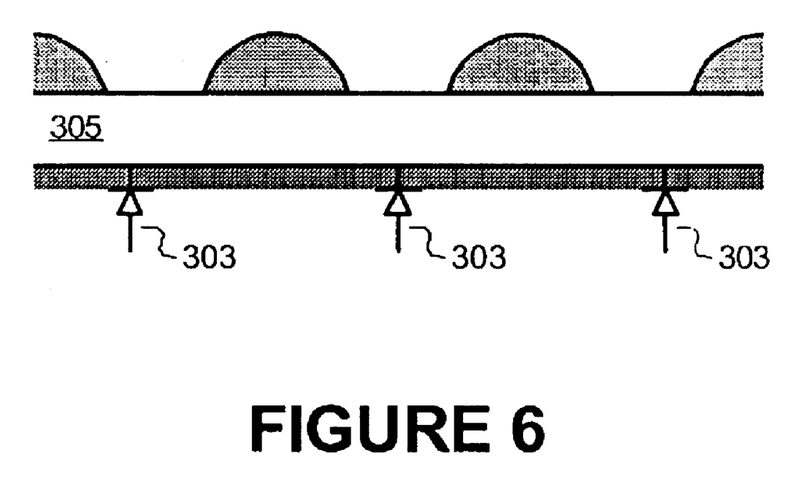

Turning to FIG. 6, once the resin layer 307 has been developed (in the case of the resin layer 307 being a photoresist) or etched (in the case of a non-photoresist sacrificial layer), the remaining portions of the resin layer 307 are heated to a reflow temperature. This causes the resin layer 307 to adopt a minimum surface tension shape, which in many cases results in a spherical shape, as shown in FIG. 6.

Once the reflow process has been finished, an anisotropic dry etch is performed using the reflowed resin layer 307 as an etching mask. In one embodiment, the etch is a reactive ion etch using $O_2$ as the primary gas and $CH_3$ as a secondary gas. In one embodiment, the etching ratio between the base material 305 and the resin layer 307 is on the order of 1.0 to 1.5. Thus, the underlying base material 305 is etched faster than the resin layer 307. In one embodiment, the etching process is complete when the resin layer 307 is removed. Because of the reflowed shape of the resin layer 307, the result of the dry etch is a hemispherical "pitting" of the base material 305 to form a concave micro-lens 701 over each light sensitive element 303. The result is seen if FIG. 7 (cross-section) and FIG. 8 (top view).

Figure 7:
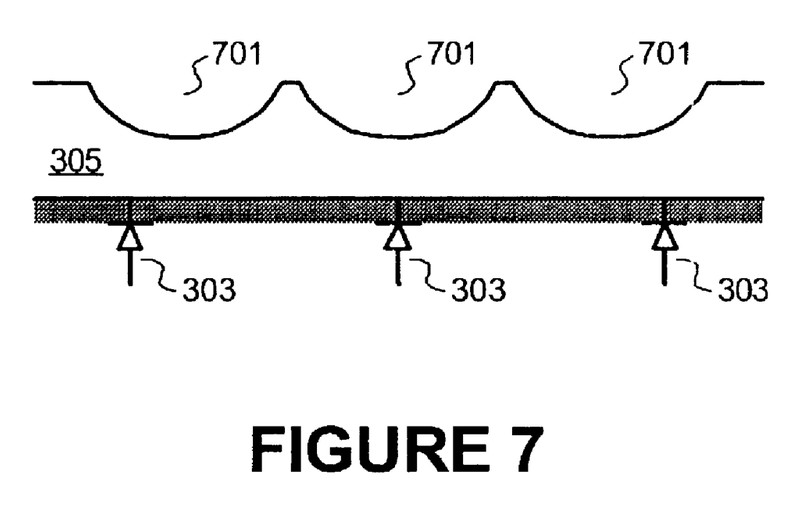
Figure 8:
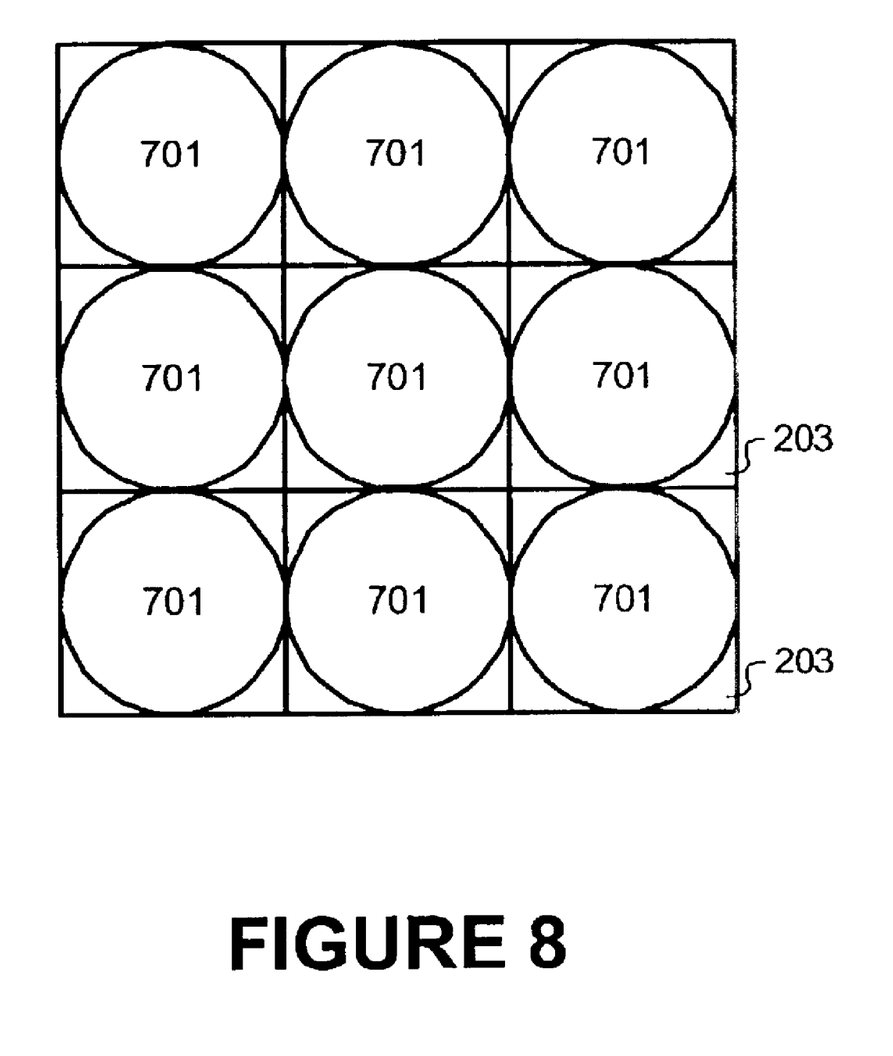

It should be noted that the spacing between adjacent micro-lenses can be varied by controlling the spacing of the removed portions 308 formed in the resin layer 307. Small removed portions 308 that are spaced far apart from each other will result in relatively small micro-lenses and large gaps between the resultant micro-lenses. Large removed portions 308 will result in large resultant micro-lenses with small gaps. Moreover, by employing over-etching techniques during etching of the base material 305 and the resin layer 307, the gaps between adjacent micro-lenses can be reduced to zero. It can be appreciated that the size of the removed portions 308, the etching length, the composition of the base material 305 and resin layer 307, and other process/design factors can be varied to achieve the desired result for the characteristics of the micro-lenses.

Figure 9:
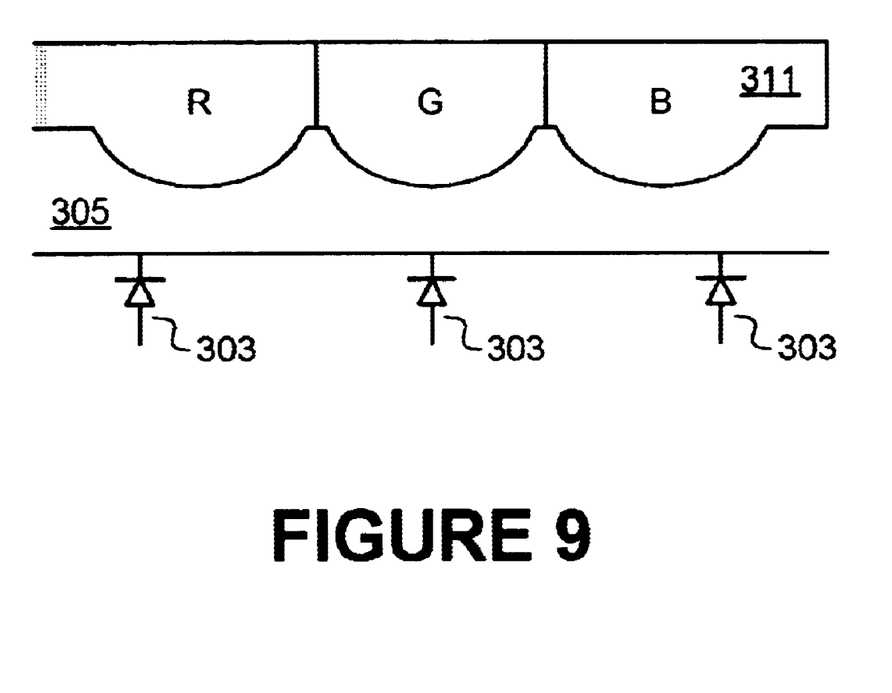

Next, turning to FIG. 9, color filters are formed into the individual micro-lens cavities. It should be noted that the color filter material 311 should have an index of refraction that is higher than the base material 305 such that bending and focusing of incident light onto the light sensitive elements 303 takes place. In one embodiment, the color filter material 311 has an index of refraction of between 1.6 and 1.8.

The color filter material 311 is pigmented or dyed such that adjacent pixels have different colors. For example, the color filter material 311 may be comprised of red color filter material, green color filter material, and blue color filter material. Alternatively, the color filter material may be comprised of cyan color filter material, magenta color filter material, and yellow color filter material. The specific color and organization of the color filter material that is formed within the concave micro-lens structures is conventional and is known in the art. Indeed, there are several techniques for the formation of the color filters, and the present invention is not limited to any particular color filter formation technology. For example, U.S. Pat. No. 6,297,071 and U.S. Pat. No. 6,274,917 (and the references cited therein) provide a good survey of the color filter art, and the portions thereof necessary to teach the formation of color filters are herein incorporated by reference. Thus, the present invention simply is the use of concave micro-lenses that are filled with color filter material of various colors, thereby providing manufacturing and performance advantages.

The formation of an appropriate color filter pattern into the micro-lenses is known in the art. For example, in one common technique, it is conventional to blanket deposit a first color (for example green) of the color filter material 311.

Figure 10:
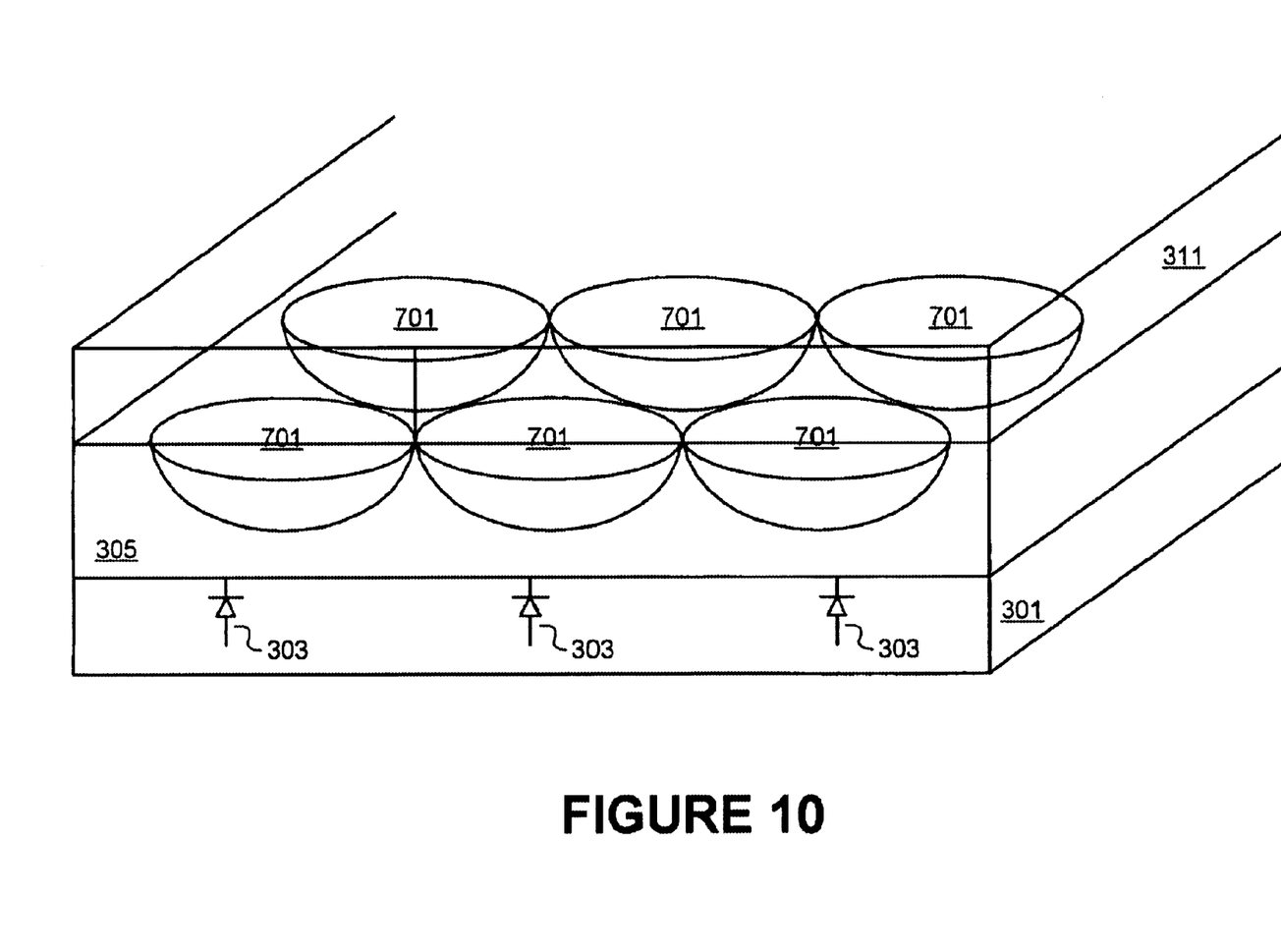
FIG. 10 is an isometric view of an apparatus according to one embodiment of the present invention.

The first color is then patterned and developed. This process removes portions of the first color over micro-lenses that are not "assigned" the first color. This process is then repeated for the remaining colors, e.g. red and blue. The result is shown in FIG. 9, where the left most pixel has the red color, the middle pixel has the green color, and the right most pixel has the blue color. An isometric view of the completed structure in shown in FIG. 10.

According to the present invention, a minimal spacing between micro-lenses can be more easily achieved. This improves the fill factor and efficiency in gathering light, thereby improving the sensitivity. Also, the concave shape of the micro-lenses provides advantages in available packaging techniques, which in turn can minimize particles and dust from interfering with the image sensor. Moreover, the use of a concave shaped micro-lens to hold the color filter material results in a relatively short focal length. This in turn allows for higher integration densities.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. An image sensor comprising:
   a plurality of pixels formed in a semiconductor substrate, each pixel including a light sensitive element;
   a base material formed over said plurality of pixels, said base material having a first index of refraction;
   a micro-lens cavity formed in said base material over said light sensitive element, said micro-lens cavity having a hemispherical concave shape; and
   a color filter material formed into said micro-lens cavity, said color filter material having a second index of refraction that is higher than said first index of refraction.

2. The image sensor of claim 1 wherein said color filter material comprises red color filter material, green color filter material, and blue color filter material.

3. The image sensor of claim 1 further including a color filter material comprises cyan color filter material, yellow color filter material, and magenta color filter material.

4. The image sensor of claim 1 wherein said micro-lens cavity filled with said color filter material is the only light focusing structure for said pixel.

5. The image sensor of claim 1 wherein said base material is either polymethylmethacrylate (PMMA) or polyglycidylmethacrylate (PGMA).

6. A pixel of an image sensor comprising:
   a light sensitive element formed in a semiconductor substrate;
   a base material formed over said light sensitive element, said base material having a first index of refraction;
   a micro-lens cavity formed in said base material over said light sensitive element, said micro-lens cavity having a hemispherical concave shape; and
   a color filter material formed into said micro-lens cavity, said color filter material having a second index of refraction that is higher than said first index of refraction.

7. The pixel of claim 6 wherein said color filter material is selected from the group of red color filter material, green color filter material, and blue color filter material.

8. The pixel of claim 6 further including a color filter material is selected from the group of cyan color filter material, yellow color filter material, and magenta color filter material.

9. The pixel of claim 7 wherein said micro-lens cavity filled with said color filter material is the only light focusing structure for said pixel.

10. The pixel of claim 6 wherein said base material is either polymethylmethacrylate (PMMA) or polyglycidylmethacrylate (PGMA).

11. A method of forming a pixel of an image sensor comprising:
    forming a light sensitive element in a semiconductor substrate;
    forming a base material over said light sensitive element, said base material having a first index of refraction;
    forming a micro-lens cavity in said base material over said light sensitive element, said micro-lens cavity having a hemispherical concave shape; and
    forming a color filter material into said micro-lens cavity, said color filter material having a second index of refraction that is higher than said first index of refraction.

12. The method of claim 11 wherein said color filter material is selected from the group of red color filter material, green color filter material, and blue color filter material.

13. The method of claim 11 further including a color filter material is selected from the group of cyan color filter material, yellow color filter material, and magenta color filter material.

14. The method of claim 11 wherein said micro-lens cavity filled with said color filter material is the only light focusing structure for said pixel.

15. The method of claim 11 wherein said base material is either polymethylmethacrylate (PMMA) or polyglycidylmethacrylate (PGMA).

16. A pixel of an image sensor comprising:
    a light sensitive element formed in a semiconductor substrate;

a base material formed over said light sensitive element, said base material having a first index of refraction;

a micro-lens cavity formed in said base material over said light sensitive element, said micro-lens cavity having a hemispherical concave shape; and a color filter material formed into said micro-lens cavity, said color filter material having a second index of refraction that is between 1.6 and 1.8.

17. The pixel of claim 16 wherein said color filter material is selected from the group of red color filter material, green color filter material, and blue color filter material.

18. The pixel of claim 16 further including a color filter material is selected from the group of cyan color filter material, yellow color filter material, and magenta color filter material.

19. The pixel of claim 16 wherein said base material is either polymethylmethacrylate (PMMA) or polyglycidyl-methaclylate (PGMA).

20. The pixel of claim 16 wherein said micro-lens cavity filled with said color filter material is the only light focusing structure for said pixel.

* * * * *